US008409785B2

(12) United States Patent
Gerard et al.

(10) Patent No.: US 8,409,785 B2
(45) Date of Patent: Apr. 2, 2013

(54) APPARATUS AND METHOD FOR TREATING IMAGING MATERIALS

(75) Inventors: Patrick Gerard, Granville (FR); Gilbert Machuel, Boissy Fresnoy (FR); Celin Savariar-Hauck, Badenhausen (DE)

(73) Assignee: Kodak Graphic Communications GmbH, Stuttgart (DE)

( * ) Notice: Subject to any disclaimer, the term of this patent is extended or adjusted under 35 U.S.C. 154(b) by 1517 days.

(21) Appl. No.: 10/565,054

(22) PCT Filed: Jul. 17, 2003

(86) PCT No.: PCT/EP03/07797

§ 371 (c)(1), (2), (4) Date: Jul. 27, 2009

(87) PCT Pub. No.: WO2005/015318

PCT Pub. Date: Feb. 17, 2005

(65) Prior Publication Data

US 2009/0317601 A1 Dec. 24, 2009

(51) Int. Cl.
*G03F 7/00* (2006.01)
*B41M 5/00* (2006.01)

(52) U.S. Cl. ...................... 430/309; 101/463.1; 430/302

(58) Field of Classification Search .................. 430/300, 430/302, 306; 101/450.1, 453, 463.1
See application file for complete search history.

(56) References Cited

U.S. PATENT DOCUMENTS 3,987,728 A * 10/1976 Miller et al. .................. 101/488
5,380,612 A * 1/1995 Kojima et al. ............... 430/49.4
6,352,811 B1 * 3/2002 Patel et al. ................. 430/270.1
2002/0064728 A1 * 5/2002 Weed et al. ................ 430/281.1
2002/0182538 A1 * 12/2002 Tomita et al. .............. 430/278.1
2003/0082493 A1 * 5/2003 Cessac .............................. 431/6
2003/0118944 A1 * 6/2003 Copeland et al. ............. 430/302
2009/0202948 A1 * 8/2009 Simpson et al. .............. 430/302

FOREIGN PATENT DOCUMENTS

CA 936035 A * 10/1973
DE 26 48 438 10/1976
DE 100 35 430 2/2002
EP 1506854 A1 * 2/2005
GB 1 330 139 11/1970
GB 1 413 374 1/1973
GB 2 205 419 12/1988
JP 2002343697 A * 11/2002

OTHER PUBLICATIONS

*WO 02/08836, English abstract.
JP Abstract 2002-343697 published Nov. 29, 2002.

* cited by examiner

*Primary Examiner* — Cynthia Kelly
*Assistant Examiner* — Chanceity Robinson
(74) *Attorney, Agent, or Firm* — J. Lanny Tucker

(57) ABSTRACT

An apparatus and method for improving the durability of an image on an imaging material, including increasing the press run length or a printing plate. The apparatus and method can involve the use of, as an example but not restricted to, an imaging device, a pre-bake oven, a processor, and a post-process treatment unit that employs infrared lamps adapted to irradiate the image.

10 Claims, 2 Drawing Sheets

APPARATUS AND METHOD FOR TREATING IMAGING MATERIALS

FIELD OF THE INVENTION

This invention relates to an apparatus and method for treating imaging materials, for example, resists and lithographic printing plates. The invention finds particular, but not exclusive, use in relation to thermal lithographic printing plates.

BACKGROUND

Thermal lithographic plates are plates that are exposed or imaged by infrared radiation and/or heat. With certain plates the infrared radiation may initiate a photochemical reaction in, for example, an onium compound, present in a coating on the plates. In such embodiments an infrared dye, also present in the coating, acts as a photosensitiser, absorbing the infrared radiation and sensitising the decomposition of the onium compound. With certain other plates, heat is itself the direct cause of imaging and is not believed to induce either a chemical decomposition of components within the coating or a photochemical reaction. In such embodiments, heat may be delivered to plates in a platesetter by a number of methods including, for example, contacting the plates with a heated body, or using charged particles or electromagnetic radiation that can be absorbed in a coating on the plate to thereby generate heat. One method of imaging thermal plates employs infrared radiation via an IR laser.

So-called Computer-To-Plate ("CTP") technology has in part been responsible for a move towards thermal lithographic plates. The required pattern in the coating on the lithographic plate may be "written" by an infrared laser, under digital control.

Two principal classes of thermal plates are now commercially available. Positive working thermal plates, such as the ELECTRA plate of Kodak Polychrome Graphics, may be exposed by imagewise heating of regions of the plate coating, typically by exposure to imaging infrared radiation, rendering to these regions more soluble in a developer and, thereby, more readily removed by a developer. This class of plates is disclosed in, for example, the PCT patent application published under the number WO 97/39894.

Negative working thermal plates, on the other hand, may be exposed to imaging infrared radiation as previously described for positive plates. They are then subjected to an overall heating step after imaging but before development. This is typically referred to as a "preheat step." This heating step is believed to selectively crosslink those regions of the coating that were selectively imaged, rendering them preferentially less soluble in a developer. Thus, on development or processing of such a plate, the regions that were not imaged are selectively developed away. A typical example of such a plate is the THERMAL PRINTING PLATE/830 of Kodak Polychrome Graphics. The technology typically utilised in these plates is disclosed in, for example, U.S. Pat. Nos. 5,340,699, 5,372,907 and 5,491,046, and can involve the use of an imaging layer comprising a resole resin, a Novolak resin, a latent Bronsted acid and an infrared absorber. The contents of these patents are incorporated herein by reference.

These negative-working plates are commonly imagewise exposed by near infrared laser light at 780-1400 nm, then pre-heated in an oven to about between 100 and 200° C. for between about one and three minutes before processing through a processor that sequentially provides the following:

1. an alkaline developer bath;
2. a rinse section; and
3. a gumming section;

which can be in an integrated processor. The plate can then be mounted on a lithographic press, whereupon many tens of thousands of prints may be obtained, although this is typically limited to 250,000 copies before the plate image is worn out. If extra copies are desired from the plate, it is known to transport the plate through a forced air oven heat the plate further, following the processing step, typically at about 285° C. for about 2 minutes. This process, called "post baking," can extend the life of the plate on the press to over 1,000,000 copies.

However, this baking process suffers from significant disadvantages in that it uses a very large oven that consumes a significant amount of electrical power with the attendant cost implications. A further disadvantage is that it has resulted in excessive or uneven heating, which can make the baked plate wavy and difficult to accurately mount on to the press. A third difficulty is that a protective gum is applied to the plate before baking, according to a widely known process sometimes referred to as the Thermotect® process, to prevent background contamination occurring during the post-baking treatment. This gum is then removed and a normal plate finisher applied if the plate is to be stored before printing, thereby requiring further time and labour to be expended. Indeed, it is generally also necessary to remove plate finisher applied following the development process before applying the protective gum prior to baking, thereby introducing even further delays and inefficiencies into the process. Notwithstanding these problems, however, plates of this type are generally baked in order to achieve greater run lengths on the press, thereby facilitating production of the desired number of copies at the end of the print run.

Consequently, it would be significantly advantageous if a treatment could be devised that overcame the disadvantages associated with post-baking methods whilst still allowing for some or all of their significant benefits, including increased run lengths, to be achieved.

SUMMARY OF THE INVENTION

The present invention can include a method for improving the durability of an image on an imaging material including directing infrared radiation upon exposed areas of the imaging material after the imaging material has been processed. According to the present invention, the improved durability due to the incidence of that IR radiation is significant.

More specifically, the present invention can include a method for increasing the press run length of a printing plate by directing infrared radiation upon image-wise exposed areas of a developed printing plate. This method can further include imagewise exposing the printing plate to form an exposed printing plate and developing the exposed printing plate to provide the developed printing plate. At least one of the directing and developing steps can take place off press or on press. Directing the infrared radiation can involve flooding the developed printing plate with infrared radiation or raster scanning infrared radiation onto the developed printing plate. The raster scanning can involve retracing the image that was applied during an image-wise exposure or can involve scanning across substantially the entire imaging area of the developed printing plate.

The infrared radiation can be supplied by infrared lamps positioned adjacent the developed printing plate. The lamps can emit infrared radiation having a wavelength of about 780 nm to about 1400 nm or, more specifically, in a range of about 800 nm to about 850 nm.

The infrared radiation can heat the developed printing plate to a temperature in the range from about 140° C. to about 160° C. The infrared radiation can be incident upon the developed printing plate for about 15 seconds to about 25 seconds.

The present invention can further include heating and cooling the printing plate before the printing plate is developed. Similarly, it can include rinsing the developed printing plate and applying a finisher to the developed printing plate.

The developed printing plate can be a negative-working lithographic printing plate, including but not limited to a thermally-imageable plate. The present invention can be applied to imaging materials other than printing plates.

The present invention can include controlling heating of the developed printing plate by controlling at least one of dwell time of the exposed material when adjacent the infrared radiation source, distance of the infrared source from the image-receptive material, output of the infrared radiation source.

The present invention can involve an apparatus for using one or more of the approaches described above. For example, it can include infrared lamps that emit infrared radiation in the range of about 780 nm to about 1400 nm. It can include an imaging device for image-wise exposing the printing plate and a processor for developing the printing plate. Still further invention can be used with or include a printing press. Still further the apparatus can include a cooling device, a rinse applicator, and/or a finisher applicator.

Generally, one embodiment of the present invention seeks to provide a method and apparatus that facilitates the treatment of imaged coatings on substrates such that significant toughening of the images occurs, i.e., increased press run lengths of printing plates or other measure of durability. Further, this embodiment seeks to eliminate or at least reduce inefficiencies in terms of cost and labour and the burdensome expenses associated with known post-baking methods. It has now surprisingly been found that such improvements may be achieved by means of an application or treatment of primarily infrared radiation following the processing (e.g., development or etching) of the imaging materials. The imaging materials on which the inventive apparatus and method can be used includes but is not limited to printing plates and resists, such as those used in the manufacture of electronic parts like printed circuit boards.

Thus, according to a first aspect of the present invention there is provided an apparatus for the production of an imaged material, said apparatus comprising:

(a) an imaging device;

(b) a bake oven;

(c) a processor; and (d) a post-process treatment unit characterised in that the post-process treatment unit comprises a unit comprising an infrared radiation source adapted to heat the imaged material to improve durability or toughening of the image.

Note that a similar embodiment of the above-noted invention could be to omit the bake oven in (b). Similarly, another embodiment can include a rinsing section (e.g., water), which are known in the industry, to remove extraneous debris and a gumming section to apply a suitable gum, thereby facilitating storage of the material for a longer period of time before use.

The apparatus can find particular applicability in the case of negative-working imaged materials, especially thermally imaged negative-working imaged materials. Most particularly, the apparatus is highly beneficial in the production of thermally imaged negative working lithographic printing plates, especially for which long run lengths are desired.

Specifically, the apparatus has particular application to thermal printing plates having imaging sensitivity in the region of between about 780 and about 1400 nm and specifically between about 800-900 nm and still more specifically about 830 nm, especially plates such as Thermal Plate 830, DITP Gold and Thermal Gold from Kodak Polychrome Graphics and Thermal News, a photopolymer plate from Kodak Polychrome Graphics. Normally the novolak-type compositions used in plates such as the Thermal Plate 830 and similar plate compositions need to be raised to above about 200° C. for significant periods of time to effect such an increase in press life. However, the apparatus according to the invention may be used in conjunction with any lithographic plate or photolithographic assembly where increased resistance to etching may be advantageous such as, for example, microlithography for printed circuit board or silicon chip manufacture.

In the case of printing plates, the further treatment provides increased resistance to harsh press conditions so that run length are generally increased to over 1,000,000 copies, which is similar to the run lengths achieved by the conventional lengthy baking procedure.

One embodiment having an infrared radiation source or emitter includes infrared lamps, such as short wavelength infrared lamps outputting IR-A light at a wavelength of about 780-1400 nm. The temperature achieved by means of this treatment or another infrared radiation embodiment can generally be in the range from about 1400 to about 195° C., and can be controlled to be in the range from about 145° to about 165° C. and should ideally be as close as possible to 155° C. Generally speaking, the plate is preferably not heated to above an upper limit such that one or more of its materials are adversely affected (e.g., buckling of the aluminum substrate) and not heated to below a lower limit such that insufficient conversion of the imaging chemistry occurs. Control can be accomplished through testing based on radiation output, distance, line speed, etc., through a feedback loop involving, for example, temperature sensors and programmable controllers, or through a combination thereof.

The dwell time at the desired temperature can be in the range from about 15 to about 25 seconds, preferably from about 18 to about 22 seconds, but most preferably as close as possible to about 20 seconds to provide a balance between achieving significant toughening of the image and maintaining satisfactory throughput speed. The transport speed of the imaging material relative to the infrared lamps can be modified based on the length of a bank of infrared lamps used in a production line, although a short length of imaging material could instead be placed under one or more infrared lamps (that could move or be stationary) and remain there for the desired dwell time. In one embodiment, ten lamps can be used and placed between 25 and 200 millimeters from the surface of the plate. Such infrared lamps are available from Victory Lighting and referred to as horizontal burn, 1.35 kW, 230V, 2800K lamp, color.

Following the exposure treatment of infrared radiation, the imaged material can be rinsed with water, and a plate finisher can be applied with known applicators. The rinsing operation is generally performed by means of spraying jets of water on to the material, whilst the finisher is typically applied by passing the material, using powered rollers, through a bath containing the finisher. Any suitable commercially available finisher may be used for this purpose.

It is worth expressing that one embodiment of the present invention uses infrared radiation to be directed incidence upon IR-sensitive reactants and to heat the reactants. The IR lamps can provide both aspects. The specific "amount" of each aspect can be modified to affect or optimize the treatment in one manner or another.

The imaging device in the apparatus according can comprise any suitable imaging or exposure device of the types known to those skilled in the art. Typically, it comprises a laser or ultra-violet imaging device, for example a platesetter or phototypesetter.

The pre-bake (or pre-process) oven can comprise a large oven, such as a fan or forced air oven, heated to a suitable temperature or, alternatively the oven and processor may be comprised in an integrated pre-heat/processor apparatus, such as the PHW 32 processor sold by Technigraph of Thetford, UK and the INTERPLATER 85 HD/135 HD Polymer processor available from Glunz & Jensen. However, many such combination devices are primarily designed for conventionally imaged negative working lithographic plates such as the Vitesse plate of Kodak Polychrome Graphics and may be less suitable for use with thermally imaged plates, since they tend to give rise to a temperature gradient that rises, for example, from the front to the rear of a plate in the preheat oven and, potentially, that rises exponentially in the rearwards direction. Other means for pre-develop heating could be used.

Evidently, conventionally imaged negative working lithographic plates are sufficiently robust that they can be used in pre-bake ovens of this type, but thermal plates are more susceptible to damage under such conditions. For example, it is believed that “fogging” at the trailing edge region and lower temperature at the leading edge can lead to unacceptable performance.

Consequently, it is preferred that a pre-bake oven specifically designed for use with thermally imaged materials should be employed for the purposes of the present invention. Preferably the pre-bake oven should be capable of controlling, and more preferably reducing, the amount of heat applied to the imaged material as the material progresses through the oven. It is desirable that the amount of heat applied to the imaged material should be reduced as it progresses through the pre-bake oven in order to prevent the temperature gradient, and resultant fogging, previously discussed. With the class of thermal printing plates which include photo sensitisers, a substantial temperature difference from one end of the plate to the other will cause different degrees of crosslinking which can give rise to different dot sizes along the plate and even a small temperature difference can be very detrimental. Or, the plate may look the same in terms of size of dot after development, but portions of the plate may exhibit lesser or greater degrees of durability and result in poor run length on printing.

The temperature control within the pre-bake oven may be such that the heat transferred to the imaged material as it progresses through the oven is reduced to compensate, at least in part, for the propensity for heat to build up towards the trailing edge of the material. Preferably the compensation is such that the temperature along the length of the material is substantially consistent, or at least is such that there is a reduced temperature differential within the material, within limits acceptable for the material in question. For example, a temperature difference between regions of the material of no more than about 30° C. may be acceptable. However, it is preferably not more than about 20° C., about 10° C., about 5° C., or even about 2° C.

Various temperature control means are available in order to achieve the said objectives. Preferably, however, the temperature can be controlled by means of a controllable mechanical barrier, which is provided between heat-emitting parts of the pre-bake oven and the imaged material progressing through the oven, the barrier being selectively operable to reduce the amount of heat applied to the material as it progresses through the oven. In addition to that temperature controlling approach, known temperature sensors and programmable controllers could be used in an oven or in conjunction with infrared lamps.

In the case of thermally imaged materials, it is not necessary that the pathway between the pre-bake oven and the processor should pass through a wash section. However, the said pathway may be such that the imaging material passes through a cooling section, which preferably comprises means for delivering coolant to the imaged material.

Coolant may be air, and it is normally adequate if the coolant is at room temperature (i.e., approximately 21° C.), although air at above or below room temperature may be used to cool the imaging material. The coolant may comprise a series of fluid jets directed onto, toward or adjacent the imaged material, but preferably it comprises a sheet of coolant directed onto the material, for example issuing from a slit arranged transverse to the direction of travel, although non-transverse arrangements may be used to change the coiling performance to possibly match a heating inconsistency. Also, rather than slits, a series of small holes may be used or some combination thereof. Thus, a cooling device may be a form of “air knife” directed onto the surface of the material. The cooling section may further comprises a pair of rollers between the pre-bake section and the processor, between which the material is conveyed.

Another cooling approach could involve causing the heated imaging material to contact a cooler surface such as a chilled plate or a chilled roller. That is, heat could be removed more through conduction than convection. Combinations of conductive and convective cooling are also contemplated.

The processor, or developing apparatus, can comprise any suitable processing device of the type known to those skilled in the art, such as the Mercury series of processors from Kodak Polychrome Graphics. The processor is a machine which serves to apply a fluid, often called a developer solution to the surface of the imaged element in order to remove and/or loosen the unexposed coating in the non-image areas and can optionally subsequently rinse the developed treated material in order to wash away the fluid or developer and any loosened or removed coating.

Typically, the developer is contained in a bath, through which the imaged material is propelled by means of powered rollers. The developer may comprise any suitable solution capable of removing the unexposed coating known to those skilled in the art. Generally, in the case of thermally imageable materials, the developer comprises an alkaline solution.

The developed material is conventionally rinsed with water, and the rinsing section of the processor usually operates by means of spraying jets of water on to the material.

A second aspect or embodiment of the present invention involves a method for preparing an imaged material, one embodiment of said method comprising the steps of:

(a) imagewise exposing an imaging material by means of laser light or ultra-violet radiation;

(b) pre-baking the imaged material in an oven;

(c) processing the imaged material; and (d) treating the imaged material after processing.

characterised in that the treating step comprises exposing the imaged material to infrared radiation in order to achieve toughening of the image.

Note that a similar embodiment of the above-noted invention could be to omit the bake oven in (b). Also, an embodiment of the present invention could employ a rinsing step using known rinsing equipment.

Imaged materials produced according to the method of the second aspect of the invention are found to have significantly improved performance when compared with materials which are obtained in the absence of the post-treatment step. Specifically, in the case of thermally imaged lithographic printing plates, the run length of the plates when employed on a printing press shows a marked improvement, and print runs in excess of one million copies are regularly achieved, which is significantly more than without the treating step. Further, as noted above, a cooling step following the pre-baking step could be employed as could other steps.

When comparing the apparatus and method of the invention with prior art systems that employ a post-baking step, it is found that imaged materials may be obtained with significant savings in terms of cost and labour, and marked improvements in overall efficiency. This may be illustrated by a simple comparison of the systems of the prior art and of the present invention. Thus, a conventional process would comprise the following steps:

1. Imagewise exposure;
2. Pre-bake at 150° C.;
3. Process
   (a) Develop
   (b) Rinse with Water
   (c) Apply Plate Finisher;
4. Wash off Plate Finisher;
5. Apply Protective Gum;
6. Post Bake for 2 Minutes at 285° C.;
7. Remove Protective Gum;
8. Apply Plate Finisher.

By way of contrast, one embodiment of the inventive method can comprise the following steps:

1. Imagewise exposure;
2. Pre-bake at 150° C.;
3. Process
   (a) Develop
   (b) Rinse with Water;
4. Post-treat
   (a) Expose to Infrared Radiation;
   (b) Rinse with Water
   (c) Apply Plate Finisher.

As noted above, a similar embodiment of the present invention can omit step 2 (Pre-Bake). That embodiment or another similar embodiment can omit step 3(*b*) (Rinse with Water) and/or step 4(*b*) (Rinse with Water), and so on. In still another embodiment, a step 3(*c*) could be included, which would be to "Apply Plate Finisher."

In addition to the various embodiments noted above, it will be apparent to those skilled in the art that various alterations, variations, combinations, and modifications may be made to the described embodiments without departing from the scope of the invention.

BRIEF DESCRIPTION OF DRAWINGS

Other objects and advantages of the invention will become apparent upon reading the following detailed description and upon reference to the drawings in which.

DETAILED DESCRIPTION OF PREFERRED EMBODIMENTS OF THE INVENTION

Figure 1:
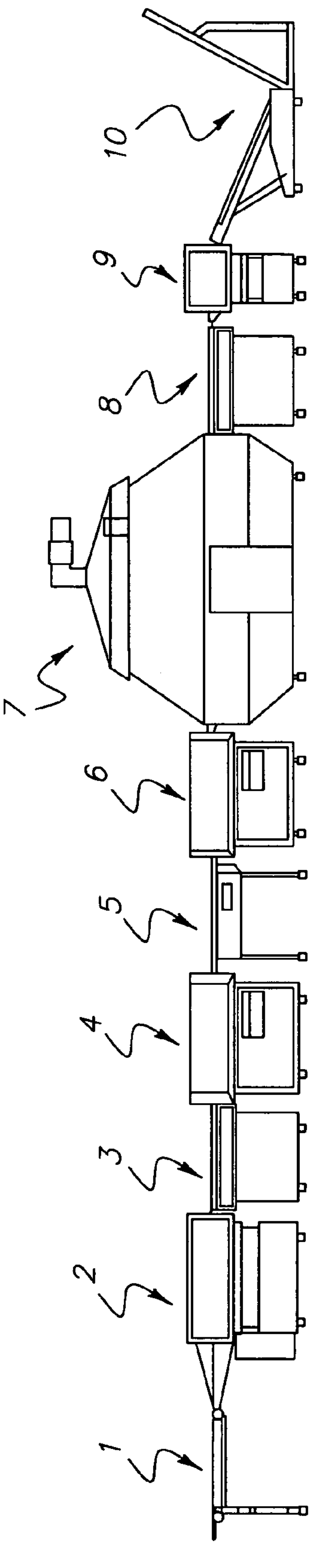
FIG. 1 schematically shows a known production line for imaging, developing, and post-baking an imaging material, such as a thermally-imaged, negative-working imaging material.

The following disclosure describes a number of embodiments of the invention, though other variations or combinations of various noted aspects of these embodiments and still other aspects are contemplated by the inventors as part of the invention.

Generally, one embodiment of the present invention seeks to provide a method and apparatus that facilitates the treatment of imaged coatings on substrates such that significant toughening of the images occurs, i.e., increased press run lengths of printing plates or other measure of durability. Further, this embodiment seeks to eliminate or at least reduce inefficiencies in terms of cost and labour and the burdensome expenses associated with known post-baking methods. It has now surprisingly been found that such improvements may be achieved by means of an application or treatment of primarily infrared radiation following the processing (e.g., development or etching) of the imaging materials. The imaging materials on which the inventive apparatus and method can be used includes but is not limited to printing plates and resists, such as those used in the manufacture of electronic parts like printed circuit boards.

Thus, according to a first aspect of the present invention there is provided an apparatus for the production of an imaged material, said apparatus comprising:

(a) an imaging device;
(b) a bake oven;
(c) a processor; and
(d) a post-process treatment unit characterised in that the post-process treatment unit comprises a unit comprising an infrared radiation source adapted to heat the imaged material to improve durability or toughening of the image.

Note that a similar embodiment of the above-noted invention could be to omit the bake oven in (b). Similarly, another embodiment can include a rinsing section (e.g., water), which are known in the industry, to remove extraneous debris and a gumming section to apply a suitable gum, thereby facilitating storage of the material for a longer period of time before use.

The apparatus can find particular applicability in the case of negative-working imaged materials, especially thermally imaged negative-working imaged materials. Most particularly, the apparatus is highly beneficial in the production of thermally imaged negative working lithographic printing plates, especially for which long run lengths are desired.

Specifically, the apparatus has particular application to thermal printing plates having imaging sensitivity in the region of between about 780 and about 1400 nm and specifically between about 800-900 nm and still more specifically about 830 nm, especially plates such as Thermal Plate 830, DITP Gold and Thermal Gold from Kodak Polychrome Graphics and Thermal News, a photopolymer plate from Kodak Polychrome Graphics. Normally the novolak-type compositions used in plates such as the Thermal Plate 830 and similar plate compositions need to be raised to above about 200° C. for significant periods of time to effect such an increase in press life. However, the apparatus according to the invention may be used in conjunction with any lithographic plate or photolithographic assembly where increased resistance to etching may be advantageous such as, for example, microlithography for printed circuit board or silicon chip manufacture.

In the case of printing plates, the further treatment provides increased resistance to harsh press conditions so that run length are generally increased to over 1,000,000 copies, which is similar to the run lengths achieved by the conventional lengthy baking procedure.

One embodiment having an infrared radiation source or emitter includes infrared lamps, such as short wavelength infrared lamps outputting IR-A light at a wavelength of about 780-1400 nm. The temperature achieved by means of this treatment or another infrared radiation embodiment can generally be in the range from about 140° to about 195° C., and can be controlled to be in the range from about 145° to about 165° C. and should ideally be as close as possible to 155° C. Generally speaking, the plate is preferably not heated to above an upper limit such that one or more of its materials are adversely affected (e.g., buckling of the aluminum substrate) and not heated to below a lower limit such that insufficient conversion of the imaging chemistry occurs. Control can be accomplished through testing based on radiation output, distance, line speed, etc., through a feedback loop involving, for example, temperature sensors and programmable controllers, or through a combination thereof.

The dwell time at the desired temperature can be in the range from about 15 to about 25 seconds, preferably from about 18 to about 22 seconds, but most preferably as close as possible to about 20 seconds to provide a balance between achieving significant toughening of the image and maintaining satisfactory throughput speed. The transport speed of the imaging material relative to the infrared lamps can be modified based on the length of a bank of infrared lamps used in a production line, although a short length of imaging material could instead be placed under one or more infrared lamps (that could move or be stationary) and remain there for the desired dwell time. In one embodiment, ten lamps can be used and placed between 25 and 200 millimeters from the surface of the plate. Such infrared lamps are available from Victory Lighting and referred to as horizontal burn, 1.35 kW, 230V, 2800K lamp, color.

Following the exposure treatment of infrared radiation, the imaged material can be rinsed with water, and a plate finisher can be applied with known applicators. The rinsing operation is generally performed by means of spraying jets of water on to the material, whilst the finisher is typically applied by passing the material, using powered rollers, through a bath containing the finisher. Any suitable commercially available finisher may be used for this purpose.

It is worth expressing that one embodiment of the present invention uses infrared radiation to be directed incidence upon IR-sensitive reactants and to heat the reactants. The IR lamps can provide both aspects. The specific "amount" of each aspect can be modified to affect or optimize the treatment in one manner or another.

The imaging device in the apparatus according can comprise any suitable imaging or exposure device of the types known to those skilled in the art. Typically, it comprises a laser or ultra-violet imaging device, for example a platesetter or phototypesetter.

The pre-bake (or pre-process) oven can comprise a large oven, such as a fan or forced air oven, heated to a suitable temperature or, alternatively the oven and processor may be comprised in an integrated pre-heat/processor apparatus, such as the PHW 32 processor sold by Technigraph of Thetford, UK and the INTERPLATER 85 HD/135 HD Polymer processor available from Glunz & Jensen. However, many such combination devices are primarily designed for conventionally imaged negative working lithographic plates such as the Vitesse plate of Kodak Polychrome Graphics and may be less suitable for use with thermally imaged plates, since they tend to give rise to a temperature gradient that rises, for example, from the front to the rear of a plate in the preheat oven and, potentially, that rises exponentially in the rearwards direction. Other means for pre-develop heating could be used.

Evidently, conventionally imaged negative working lithographic plates are sufficiently robust that they can be used in pre-bake ovens of this type, but thermal plates are more susceptible to damage under such conditions. For example, it is believed that "fogging" at the trailing edge region and lower temperature at the leading edge can lead to unacceptable performance.

Consequently, it is preferred that a pre-bake oven specifically designed for use with thermally imaged materials should be employed for the purposes of the present invention. Preferably the pre-bake oven should be capable of controlling, and more preferably reducing, the amount of heat applied to the imaged material as the material progresses through the oven. It is desirable that the amount of heat applied to the imaged material should be reduced as it progresses through the pre-bake oven in order to prevent the temperature gradient, and resultant fogging, previously discussed. With the class of thermal printing plates which include photo sensitisers, a substantial temperature difference from one end of the plate to the other will cause different degrees of crosslinking which can give rise to different dot sizes along the plate and even a small temperature difference can be very detrimental. Or, the plate may look the same in terms of size of dot after development, but portions of the plate may exhibit lesser or greater degrees of durability and result in poor run length on printing.

The temperature control within the pre-bake oven may be such that the heat transferred to the imaged material as it progresses through the oven is reduced to compensate, at least in part, for the propensity for heat to build up towards the trailing edge of the material. Preferably the compensation is such that the temperature along the length of the material is substantially consistent, or at least is such that there is a reduced temperature differential within the material, within limits acceptable for the material in question. For example, a temperature difference between regions of the material of no more than about 30° C. may be acceptable. However, it is preferably not more than about 20° C., about 10° C., about 5° C., or even about 2° C.

Various temperature control means are available in order to achieve the said objectives. Preferably, however, the temperature can be controlled by means of a controllable mechanical barrier, which is provided between heat-emitting parts of the pre-bake oven and the imaged material progressing through the oven, the barrier being selectively operable to reduce the amount of heat applied to the material as it progresses through the oven. In addition to that temperature controlling approach, known temperature sensors and programmable controllers could be used in an oven or in conjunction with infrared lamps.

In the case of thermally imaged materials, it is not necessary that the pathway between the pre-bake oven and the processor should pass through a wash section. However, the said pathway may be such that the imaging material passes through a cooling section, which preferably comprises means for delivering coolant to the imaged material.

Coolant may be air, and it is normally adequate if the coolant is at room temperature (i.e., approximately 21° C.), although air at above or below room temperature may be used to cool the imaging material. The coolant may comprise a series of fluid jets directed onto, toward or adjacent the imaged material, but preferably it comprises a sheet of coolant directed onto the material, for example issuing from a slit arranged transverse to the direction of travel, although non-transverse arrangements may be used to change the coiling performance to possibly match a heating inconsistency. Also, rather than slits, a series of small holes may be used or some combination thereof. Thus, a cooling device may be a form of "air knife" directed onto the surface of the material. The cooling section may further comprises a pair of rollers between the pre-bake section and the processor, between which the material is conveyed.

Another cooling approach could involve causing the heated imaging material to contact a cooler surface such as a chilled plate or a chilled roller. That is, heat could be removed more through conduction than convection. Combinations of conductive and convective cooling are also contemplated.

The processor, or developing apparatus, can comprise any suitable processing device of the type known to those skilled in the art, such as the Mercury series of processors from Kodak Polychrome Graphics. The processor is a machine which serves to apply a fluid, often called a developer solution to the surface of the imaged element in order to remove and/or loosen the unexposed coating in the non-image areas and can optionally subsequently rinse the developed treated material in order to wash away the fluid or developer and any loosened or removed coating.

Typically, the developer is contained in a bath, through which the imaged material is propelled by means of powered rollers. The developer may comprise any suitable solution capable of removing the unexposed coating known to those skilled in the art. Generally, in the case of thermally imageable materials, the developer comprises an alkaline solution.

The developed material is conventionally rinsed with water, and the rinsing section of the processor usually operates by means of spraying jets of water on to the material.

A second aspect or embodiment of the present invention involves a method for preparing an imaged material, one embodiment of said method comprising the steps of:

(a) imagewise exposing an imaging material by means of laser light or ultra-violet radiation;
(b) pre-baking the imaged material in an oven;
(c) processing the imaged material; and
(d) treating the imaged material after processing.

characterised in that the treating step comprises exposing the imaged material to infrared radiation in order to achieve toughening of the image.

Note that a similar embodiment of the above-noted invention could be to omit the bake oven in (b). Also, an embodiment of the present invention could employ a rinsing step using known rinsing equipment.

Imaged materials produced according to the method of the second aspect of the invention are found to have significantly improved performance when compared with materials which are obtained in the absence of the post-treatment step. Specifically, in the case of thermally imaged lithographic printing plates, the run length of the plates when employed on a printing press shows a marked improvement, and print runs in excess of one million copies are regularly achieved, which is significantly more than without the treating step. Further, as noted above, a cooling step following the pre-baking step could be employed as could other steps.

When comparing the apparatus and method of the invention with prior art systems that employ a post-baking step, it is found that imaged materials may be obtained with significant savings in terms of cost and labour, and marked improvements in overall efficiency. This may be illustrated by a simple comparison of the systems of the prior art and of the present invention. Thus, a conventional process would comprise the following steps:

1. Imagewise exposure;
2. Pre-bake at 150° C.;
3. Process
   (a) Develop
   (b) Rinse with Water
   (c) Apply Plate Finisher;
4. Wash off Plate Finisher;
5. Apply Protective Gum;
6. Post Bake for 2 Minutes at 285° C.;
7. Remove Protective Gum;
8. Apply Plate Finisher.

By way of contrast, one embodiment of the inventive method can comprise the following steps:

1. Imagewise exposure;
2. Pre-bake at 150° C.;
3. Process
   (a) Develop
   (b) Rinse with Water;
4. Post-treat
   (a) Expose to Infrared Radiation;
   (b) Rinse with Water
   (c) Apply Plate Finisher.

As noted above, a similar embodiment of the present invention can omit step 2 (Pre-Bake). That embodiment or another similar embodiment can omit step 3(*b*) (Rinse with Water) and/or step 4(*b*) (Rinse with Water), and so on. In still another embodiment, a step 3(*c*) could be included, which would be to "Apply Plate Finisher."

Figure 2:
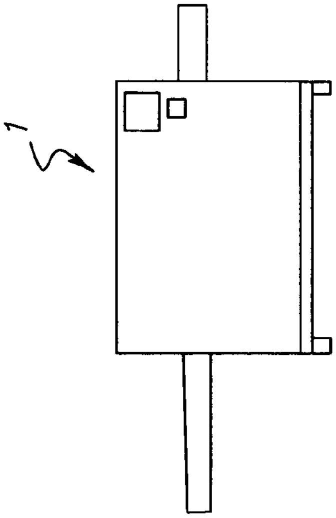
FIG. 2 schematically shows an embodiment of the present invention for post-treating an imaging material using primarily infrared radiation.

Thus, the greater practicality of the method of the present invention is clearly apparent, and the corresponding benefits which accrue in terms of the scaling down of the apparatus are apparent from FIGS. 1 and 2.

FIG. 1 shows part of a conventional production line used for the preparing a thermally imaged negative-working imaging materials. FIG. 2 shows a post treatment unit as employable, for example, in the apparatus according to the first aspect of the present invention, drawn to the same scale as FIG. 1.

Considering FIG. 1, which would typically be used for the processing of lithographic printing plates, there is shown a conveyor section 1 which feeds the imaged plate to a processor 2, which contains developer and wherein development of the plate occurs prior to passage through rinse unit 3 and processor 4, containing plate finisher. Printing plates that are to be used for short print runs are taken from the line at this point and do not undergo post-baking. However, plates that are required to perform longer print runs and require a post-baking treatment continue through rinse unit 5, which removes the plate finisher, before entering processor 6, wherein a protective gum or so-called "pre-bake solution" is applied.

The plates are then baked in oven 7, after which the protective gum is removed in rinse unit 8 and plate finisher is again applied by passing through processor 9, the final printing plated being collected in stacker 10. Clearly, the section of this processing of post-baked plates wherein plate finisher is applied after development, only to be removed again in order that a protective gum may be applied prior to post-baking, represents a waste of time and materials. However, this can be less costly than rearranging the production line on every occasion or certain occasions when production is to be changed from short run (non-post-baked) plates to long run (post-baked) plates.

Figure 3:
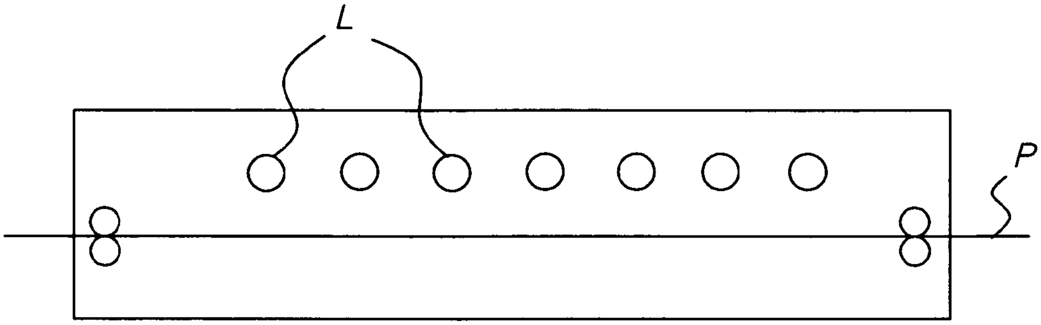
FIG. 3 schematically shows the interior of the embodiment of the invention shown in FIG. 2, including an imaging material being driven beneath a bank of infrared lamps.

Turning now to the embodiment shown in FIGS. 2 and 3, there is shown a post-developer treatment unit 1 wherein an imaged, developed plate P is exposed to infrared radiation via one or more infrared lamps L, then, for example, can be rinsed with water and finally treated with a plate finisher. This unit can be aligned downstream of a processor and rinse unit (such as 2 and 3 in FIG. 1), and upstream of a stacker (such as 10 in FIG. 1) and the resulting combination then serves to provide similarly positive run-length results as those provided by the lengthy processing line of FIG. 1. As noted above, it can eliminate one or more time-consuming and costly steps and structure used in known methods and apparatus.

Figure 4:
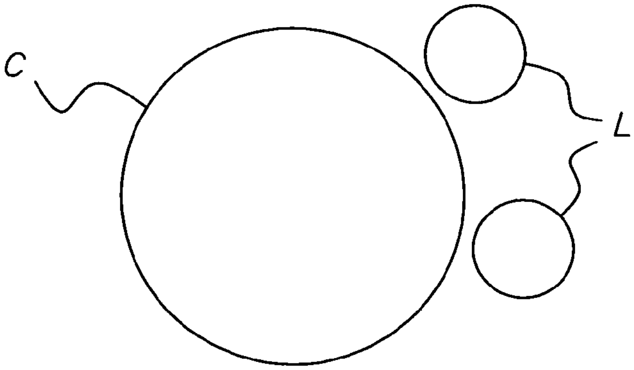
FIG. 4 schematically shows an alternative embodiment of the present invention in which infrared lamps are positioned to flood expose a printing plate mounted on a cylinder.

Other in-line and off-line arrangements can be employed to make use of the inventive treatment. Further, FIG. 4 shows a cylinder C around which a printing plate can be positioned and adjacent which one or more infrared lamps L can be positioned to treat the printing plate according to the present invention. This embodiment or a variation of it could be used, for example, in conjunction with on-press development and treatment. That is, a printing plate that is being developed on-press can likewise be treated according to the present invention while being on-press. Such an arrangement could involve developing the plate with a press liquid (e.g., water, ink, etc.), squeezing off or drying off the liquid (or allowing it to transfer off), then treating the developed plate. Still further variations on these approaches are envisioned. As a result of the above, an embodiment of the present invention can include known on-press development steps (as part of the inventive method) and known printing presses (as part of the apparatus).

Although the invention has been described in terms of the foregoing embodiments, it will be apparent to those skilled in the art that various alterations, variations, combinations, and modifications may be made to the described embodiments without departing from the scope of the invention. For example, one or more methods, steps of methods, apparatus, and structure of apparatus described above can be combined into fewer methods, steps, apparatus, or structure, or broken out into more methods, steps, apparatus, or structure. The disclosed embodiments are provided merely by way of example.

For example, heat can be contributed to the plates by running the developed plate over a heated platen, rollers, or belt. Other conductive heating approaches (or convective or radiative heating approaches) could be employed. These alternative heating approaches can be used in conjunction with the heat provided by the IR lamps.

The invention claimed is:

1. A method for improving the durability of an image on a thermally imaged material that has been processed, comprising directing infrared radiation upon exposed areas of the thermally imaged and processed material, wherein the thermally imaged negative-working material comprises a thermally imaged lithographic printing plate and wherein improving durability of the thermally imaged material increases the press run length of the thermally imaged negative-working lithographic printing plate, the method further comprising:

heating the thermally imaged lithographic printing plate before the thermally imaged negative-working lithographic printing plate is developed;

cooling the thermally imaged lithographic printing plate before the thermally imaged negative-working lithographic printing plate is developed;

rinsing the thermally imaged and processed negative-working lithographic printing plate; and applying a finisher to the thermally imaged and developed negative-working lithographic printing plate.

2. The method of claim 1 further comprising:

imagewise thermally exposing the lithographic printing plate to form a thermally imaged lithographic printing plate; and developing the thermally imaged lithographic printing plate to provide the thermally imaged and processed negative-working lithographic printing plate.

3. The method of claim 2, wherein at least one of the imagewise thermally exposing and developing steps is carried out off press.

4. The method of claim 2, wherein at least one of the imagewise thermally exposing and developing steps is carried out on press.

5. The method of claim 1, wherein the step of directing comprises at least one of flooding the thermally imaged and processed material with infrared radiation and raster scanning infrared radiation onto the thermally imaged and processed material.

6. The method of claim 1, wherein the directing step comprising positioning infrared lamps adjacent the thermally imaged and processed material, wherein the infrared lamps emit infrared radiation having a wavelength of about 780 nm to about 1400 nm.

7. The method of claim 6, wherein the infrared lamps emit infrared radiation having a wavelength in a range of about 800 nm to about 850 nm.

8. The method of claim 1, wherein the directing step comprising heating the thermally imaged and processed material to a temperature in the range from about 140° C. to about 160° C.

9. The method of claim 1, wherein the directing step comprises directing the infrared radiation incident upon the thermally imaged and processed material for about 15 seconds to about 25 seconds.

10. The method of claim 1, further comprising controlling heating of the thermally imaged and processed material by controlling at least one of dwell time of the thermally imaged and processed material when adjacent the infrared radiation source, distance of the infrared source from the thermally imaged and processed material, and output of the infrared radiation source.

* * * * *